(12) United States Patent
Bhusari et al.

(10) Patent No.: US 8,822,817 B2
(45) Date of Patent: Sep. 2, 2014

(54) DIRECT WAFER BONDING

(75) Inventors: Dhananjay M. Bhusari, North Hills, CA (US); Daniel C. Law, Arcadia, CA (US)

(73) Assignee: The Boeing Company, Chicago, IL (US)

(*) Notice: Subject to any disclaimer, the term of this patent is extended or adjusted under 35 U.S.C. 154(b) by 381 days.

(21) Appl. No.: 12/960,248

(22) Filed: Dec. 3, 2010

(65) Prior Publication Data

US 2012/0138116 A1 Jun. 7, 2012

(51) Int. Cl.
| | |
|---|---|
| H01L 31/0304 | (2006.01) |
| H01L 31/18 | (2006.01) |
| H01L 25/04 | (2014.01) |
| H01L 21/20 | (2006.01) |
| H01L 31/0687 | (2012.01) |
| H01L 31/0693 | (2012.01) |

(52) U.S. Cl.
CPC ........... *H01L 21/2007* (2013.01); *Y02E 10/544* (2013.01); *H01L 31/1844* (2013.01); *H01L 25/045* (2013.01); *H01L 31/0687* (2013.01); *H01L 31/1892* (2013.01); *H01L 31/0693* (2013.01)
USPC .................. 136/262; 438/74; 438/77; 438/93

(58) Field of Classification Search
CPC .................................................. H01L 31/0693
USPC ................. 136/255–267; 438/57–98; 257/21, 257/183–190
See application file for complete search history.

(56) References Cited

U.S. PATENT DOCUMENTS

| | | | |
|---|---|---|---|
| 6,316,332 | B1 | 11/2001 | Lo et al. |
| 6,333,208 | B1 | 12/2001 | Li |
| 6,340,788 | B1 | 1/2002 | King et al. |
| 7,078,353 | B2 | 7/2006 | Daval et al. |
| 7,122,733 | B2 | 10/2006 | Narayanan et al. |
| 7,217,636 | B1 | 5/2007 | Atanackovic |
| 7,601,217 | B2 | 10/2009 | Faure et al. |
| 7,670,929 | B2 | 3/2010 | Bourdelle et al. |
| 2003/0213950 | A1* | 11/2003 | Hwang ........................... 257/18 |
| 2004/0200523 | A1 | 10/2004 | King et al. |
| 2005/0161078 | A1 | 7/2005 | Aiken |
| 2006/0021565 | A1 | 2/2006 | Zahler et al. |
| 2006/0185582 | A1* | 8/2006 | Atwater et al. ................. 117/89 |
| 2006/0240640 | A1 | 10/2006 | Nesterenko et al. |
| 2007/0131275 | A1 | 6/2007 | Kinsey et al. |
| 2009/0072243 | A1* | 3/2009 | Suda et al. ...................... 257/77 |
| 2010/0116327 | A1* | 5/2010 | Cornfeld ........................ 136/255 |
| 2010/0212729 | A1* | 8/2010 | Hsu ................................ 136/255 |

OTHER PUBLICATIONS

Tanabe et al., Lattice-Mimatched Monolithic GaAs/InGaAs Two-Junction Solar Cells by Direct Wafer Bonding, IEEE (2006).*

(Continued)

*Primary Examiner* — Jayne Mershon
(74) *Attorney, Agent, or Firm* — Smith Moore Leatherwood LLP

(57) ABSTRACT

The disclosure provides for a direct wafer bonding method including providing a bonding layer upon a first and second wafer, and directly bonding the first and second wafers together under heat and pressure. The method may be used for directly bonding an GaAs-based, InP-based, GaP-based, GaSb-based, or Ga(In)N-based device to a GaAs device by introducing a highly doped (Al)(Ga)InP(As)(Sb) layer between the devices. The bonding layer material forms a bond having high bond strength, low electrical resistance, and high optical transmittance.

30 Claims, 9 Drawing Sheets

(56) References Cited

OTHER PUBLICATIONS

Tanabe et al., Lattice Mismatched Monolithic GaAs/InGaAs Two-Junction Solar Cells by Direct Wafer Bonding, IEEE, pp. 768-771 (2006).*

Tanabe et al., Direct Bonded GaAs/InGaAs Tandem Solar Cell, Applied Physics Letters, vol. 89, pp. 102106/1-3, (2006).*

Law, Daniel C. et al., 34th IEEE Photovoltaic Specialist Conference (PVSC) (2009), Semiconductor-Bonded III-V Multijunction Space Solar Cells, Boeing-Spectrolab, Inc., pp. 1-4.

Tanabe, Katsuki et al.: "Direct-bonded GaAs/InGaAs tandem solar cell;" Applied Physics Letters; 2006; American Institute of Physics; Sep. 6, 2006.

PCT International Search Report, 10 pages, Mar. 2012.

* cited by examiner

DIRECT WAFER BONDING

This disclosure was made with U.S. Government support under Contract No. 05-C-0049 (IWA 050224). The U.S. Government has certain rights in this disclosure.

FIELD

The present disclosure generally relates to devices and methods for joining dissimilar materials together, and in particular to a method for joining two semiconductor wafers together using a (Al)(Ga)InP(As)(Sb) bonding interlayer.

BACKGROUND

Wafer joining technology can be used to integrate different materials with various properties into one compact process-compatible material system. The technology has great potential to innovate the current high technology industries. For example, joining GaAs or InP-based materials to other semiconductor materials can result in the integration of optical, photovoltaic, and electronic devices and enhance the performance of computers, solar cells, light emitting diodes and other electronic devices.

One of the limitations in Group III-V semiconductor devices, such as multijunction solar cells, is incorporating Group III-V layers with desirable bandgap combination into a device that is lattice-matched with the growth substrate. This severely limits the choice of bandgaps that can be incorporated into the device and thus prevents the fabrication of devices with optimal performance. It is hence desirable to develop a method that allows integration of devices grown on different substrates so that the lattice matching constraints with the growth substrate can be reduced.

Existing solutions such as the growth of lattice-mismatched (metamorphic) layers, mechanical stacking, and indirect wafer bonding have been used. In the metamorphic approach, a buffer layer with controlled gradient in the lattice constant is grown between the substrate and the desired metamorphic layer. In the indirect wafer bonding approach, devices are grown on different substrates having different lattice constants, and a dielectric or metal layer is deposited upon the top surface of the devices. The devices are then integrated mechanically or electrically via wafer bonding. One or both of the substrates may be eventually removed.

In the metamorphic approach, the introduction of a buffer layer with a controlled adjustment in lattice constant can introduce high densities of defects, and may lead to the growth of non-optimal quality device layer reducing device performance. In the indirect wafer bonding approach, the bonding is done via deposition of an adhesion layer, e.g. $SiO_2$, $Si_3N_4$, other dielectrics, metal oxides, metals etc. on individual wafers prior to bonding (called indirect bonding). Although it does not necessitate high temperature annealing, the $SiO_2$, $Si_3N_4$, and metal oxides etc 'bonding layers' are insulating, which does not allow monolithic electrical integration of the bonded devices. On the other hand, indirect bonding using metal layers as bonding interlayers make the bonded interface optically opaque, preventing optical integration of the devices on the opposite sides of the bonded interface. In the prior art of direct bonding, the direct bonded interface needs to be annealed at high temperatures (typically exceeding 500° C.) for a significant period of time (typically few hours) to obtain a mechanically robust interface with low electrical resistance. Such high temperature annealing for prolonged periods of time will often lead to reduced performance in many devices.

The existing semiconductor-semiconductor direct bonding solution between GaAs and InP materials suffers from low bond strength unless annealed at high temperatures (>500° C.) for extended periods of time. The existing indirect bonding solutions do not allow both electrically conductive and optically transparent integration across the indirect bonded interface.

There exists a need for an improved method for directly bonding semiconductor wafers that improves the mechanical integrity, optical transparency, and electrical resistance at the bond interfaces to achieve an increase in power output, efficiency, performance, and cost effectiveness.

SUMMARY

This disclosure provides an epitaxially grown (Al)(Ga)InP(As)(Sb) bonding layer on GaAs and InP device or substrate to improve direct semiconductor bonding of GaAs-based materials with InP-based, GaP-based, GaSb-based, Ga(In)N-based materials for solar cell and other applications. Highly uniform wafer level direct semiconductor bonding with high mechanical strength (greater than 4 $J/m^2$) is achieved at relatively low bonding temperatures of 350° C. In addition, very low electrical resistance (on the order of 0.3 Ohm-$cm^2$) and high optical transmittance (greater than 97%) are achieved across the semiconductor bonded interface.

In accordance with the disclosure, an assembly is disclosed that includes a first wafer, a first bonding layer upon the first wafer, a second wafer, and a second bonding layer upon the second wafer. The first and second bonding layers are directly bonded to form a bonded interface. The first and second bonding layers are lattice matched to the first and second wafers, respectively.

In accordance with the disclosure, a method for making a bonded assembly is disclosed that includes providing a first wafer, forming a first bonding layer upon the first wafer to form a first subassembly, providing a second wafer, forming a second bonding layer upon the second wafer to form a second subassembly, and bonding the first bonding layer to the second bonding layer. The first and second bonding layers are lattice matched to the first and second wafers, respectively.

Other features and advantages of the present disclosure will be apparent from the following more detailed description of the preferred embodiment, taken in conjunction with the accompanying drawings, which illustrate, by way of example, the principles of the disclosure. The scope of the disclosure is not, however, limited to this preferred embodiment.

BRIEF DESCRIPTION OF THE DRAWINGS

Wherever possible, the same reference numbers will be used throughout the drawings to represent the same parts.

DETAILED DESCRIPTION

The present disclosure introduces an epitaxially grown bonding layer at the bonding interface, which can be doped as desired to control the electrical resistance across the direct bonded interface, and achieves improvement in mechanical bond strength. The epitaxially grown bonding layer is a highly doped (Al)(Ga)InP(As)(Sb) layer.

Figure 1:
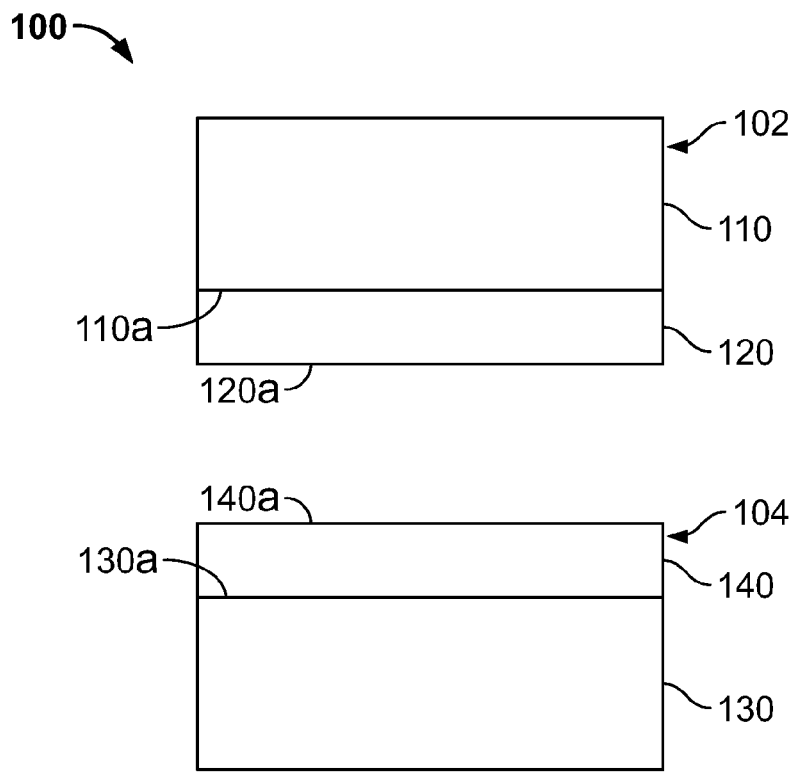
FIG. 1 illustrates an embodiment of a preassembled structure according to the present disclosure.

FIG. 1 illustrates an embodiment of a preassembled structure 100 according to an embodiment of the disclosure. As can be seen in FIG. 1, the preassembled structure 100 includes a first subassembly 102 and a second subassembly 104. The first subassembly 102 includes a first wafer 110 and a first bonding layer 120 directly adjacent and upon a first surface 110a of the first wafer 110.

The first wafer 110 is a semiconductor selected from group III-V materials. In an embodiment, the first wafer 110 is selected from the group consisting of silicon (Si), germanium (Ge), GaAs-based, InP-based, GaP-based, GaSb-based, Ga(In)N-based materials. In another embodiment, the first wafer 110 includes one or more material layers. In another embodiment, the first wafer 110 includes one or more semiconductor material layers, structures, or devices. In an embodiment, the first wafer 110 may be a photovoltaic device. In another embodiment, the first wafer 110 may be a solar cell having one or more subcells.

The first wafer 110 includes a surface 110a. The surface 110a must be a surface of a material layer selected from the group consisting of silicon (Si), germanium (Ge), GaAs-based, InP-based, GaP based, GaSb-based, Ga(In)N-based materials.

The first bonding layer 120 is epitaxially grown upon the first wafer 110, and in particular, upon the surface 110a. The first bonding layer is an (Al)(Ga)InP(As)(Sb) material. In an embodiment, the first bonding layer is an (Al)(Ga)InP(As)(Sb) material having a dopant concentration equal to or greater than about $5\times10^{18}$/cm$^3$. High doping concentration is not necessary for good mechanical bonding, but essential for achieving low electrical resistance across the bonded interface. If low resistance is not necessary for a particular device, then high doping concentration in the bonding layer is not necessary. As used herein, and as conventional in the art, the use of parentheses in the (Al)(Ga)InP(As)(Sb) material indicates that the incorporation of aluminum, gallium, arsenic, and antimony is optional. The first bonding layer 120 is lattice matched to the first wafer 110. The first bonding layer 120 has a bonding surface 120a. As used herein, the term "lattice matched" means that the lattice constants of the compared layers differ by less than 1%, and the term "lattice mismatched" means that the lattice constants of the compared layers differ by more than 1%.

The second subassembly 104 includes a second wafer 130 and a second bonding layer 140 directly adjacent and upon a surface 130a of the second wafer 130. The second wafer 130 is selected from group III-V materials. In an embodiment, the second wafer 130 is selected from the group consisting of silicon (Si), germanium (Ge), GaAs-based, InP-based, GaP based, GaSb-based, Ga(In)N-based materials. In another embodiment, the second wafer 130 includes one or more material layers. In another embodiment, the second wafer 130 includes one or more semiconductor material layers or structures. In an embodiment, the second wafer 130 may be a photovoltaic device. In another embodiment, the second wafer 130 may be a solar cell having one or more subcells.

The second wafer 130 includes a surface 130a. The surface 130a must be a surface of a material layer selected from the group consisting of silicon (Si), germanium (Ge), GaAs-based, InP-based, GaP based, GaSb-based, Ga(In)N-based materials. The second bonding layer 140 is epitaxially grown upon the second wafer 130, and in particular, upon the surface 130a. In particular, the second bonding layer 140 is grown upon a semiconductor material layer of the second wafer 130. The second bonding layer 140 is (Al)(Ga)InP(As)(Sb) having a dopant concentration equal to or greater than about $5\times10^{18}$/cm$^3$. As discussed above, high doping concentration is not necessary for good mechanical bonding, but essential for achieving low electrical resistance across the bonded interface. If low resistance is not necessary for a particular device, then high doping concentration in the bonding layer is not necessary. The second bonding layer 140 is lattice matched to the second wafer 130. The second bonding layer 140 has a bonding surface 140a.

Figure 1A:
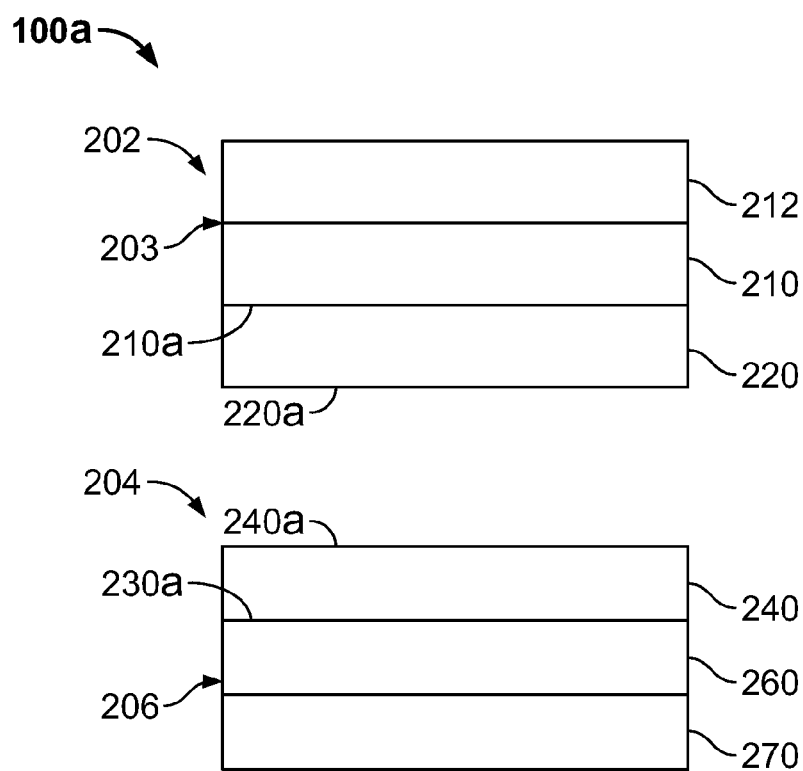
FIG. 1A illustrates another embodiment of a preassembled structure according to the present disclosure.

FIG. 1A illustrates another embodiment of a preassembled structure 100a according to an embodiment of the disclosure. As can be seen in FIG. 1A, the preassembled structure 100a includes a first subassembly 202 and a second subassembly 204. The first subassembly 202 includes a first wafer 203 and a first bonding layer 220 directly adjacent and upon a first surface 210a of the first wafer 203.

The first wafer 203 includes a first layer 210 and a first base layer 212. In another embodiment, the first wafer 203 includes two or more material layers. In another embodiment, the first wafer 203 includes two or more semiconductor material layers, structures or devices. In an embodiment, the first wafer 203 may be a photovoltaic device. In another embodiment, the first wafer 203 may be a multijunction solar cell. In another embodiment, the first wafer 203 may be a solar cell having one or more subcells. In another embodiment, the first wafer 203 may be a multijunction solar cell. In an embodiment, the first base layer 212 may be a substrate.

The first wafer 203 includes a surface 210a. The surface 210a must be a surface of a material layer selected from the group consisting of silicon (Si), germanium (Ge), GaAs-based, InP-based, GaP based, GaSb-based, Ga(In)N-based materials. The first bonding layer 220 is epitaxially grown upon the first wafer 203, and in particular, upon the surface 210a. The first bonding layer is an (Al)(Ga)InP(As)(Sb) material. In an embodiment, the first bonding layer is an (Al)(Ga)InP(As)(Sb) material having a dopant concentration equal to or greater than about $5\times10^{18}$/cm$^3$. The first bonding layer 220 is lattice matched to the first wafer 203.

The second subassembly 204 includes a second wafer 206 and a second bonding layer 240 directly adjacent and upon a surface 230a of the second wafer 206. The second wafer 206 includes a first layer 260 and a second base layer 270. In another embodiment, the second wafer 206 includes two or more material layers. In another embodiment, the second wafer 206 includes two or more semiconductor material layers, structures or devices. In an embodiment, the second wafer 206 may be a photovoltaic device. In another embodiment, the second wafer 206 may be a multijunction solar cell. In another embodiment, the second wafer 206 may be a solar cell having one or more subcells. In an embodiment, the second base layer 270 may be a substrate.

The second wafer 206 includes a surface 230a. The surface 230a must be a surface of a material layer selected from the group consisting of silicon (Si), germanium (Ge), GaAs-based, InP-based, GaP based, GaSb-based, Ga(In)N-based materials. The second bonding layer 240 is epitaxially grown upon the second wafer 206, and in particular, upon the surface 230a. The second bonding layer 240 is an (Al)(Ga)InP(As)(Sb) material. In an embodiment, the second bonding layer 240 is an (Al)(Ga)InP(As)(Sb) material having a dopant concentration equal to or greater than about $5 \times 10^{18}/cm^3$. The second bonding layer 240 is lattice matched to the second wafer 206.

Figure 2:
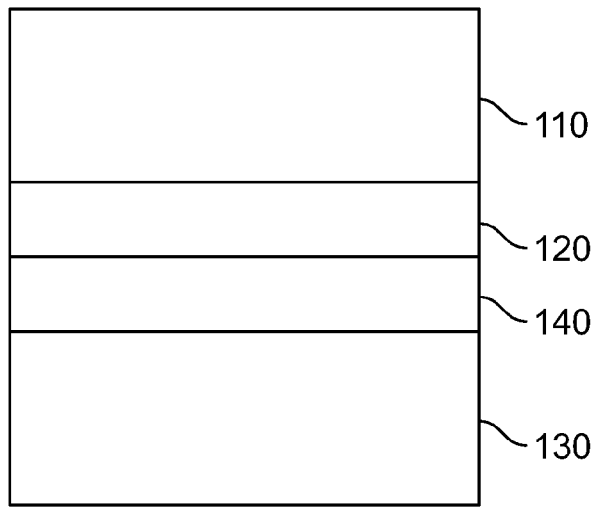
FIG. 2 illustrates the preassembled structure of FIG. 1 assembled.

FIG. 2 illustrates a bonded assembly 200 according to an embodiment of the disclosure. As can be seen in FIG. 2, the first and second bonding layers 120, 140 have been bonded to join the first subassembly 102 to the second subassembly 104. In an embodiment, the bonded assembly 200 may be a photovoltaic device. In another embodiment, the bonded assembly 200 may be a solar cell, light sensor, light emitting diode, transistor or other device.

Figure 2A:
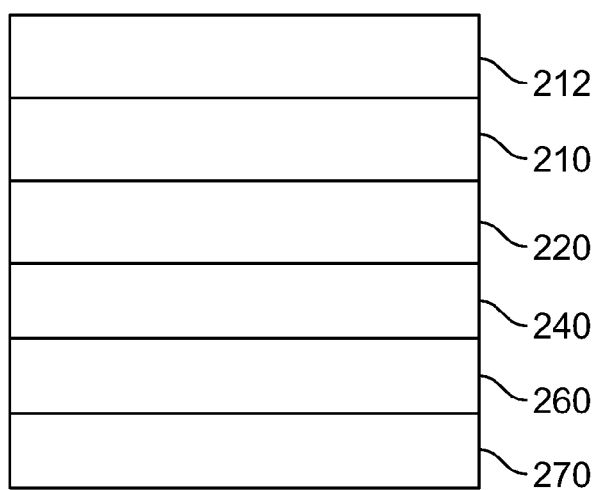
FIG. 2A illustrates the preassembled structure of FIG. 1A assembled.

FIG. 2A illustrates a bonded assembly 200a according to an embodiment of the disclosure. As can be seen in FIG. 2A, the first and second bonding layers 220, 240 have been bonded to join the first subassembly 203 to the second subassembly 206. In an embodiment, the bonded assembly 200a may be a photovoltaic device. In another embodiment, the bonded assembly 200a may be a solar cell, light sensor, light emitting diode, transistor or other device.

An embodiment of a method of bonding the first and second subassemblies 102, 104 of FIG. 1 to form the bonded assembly of FIG. 2 will now be discussed. Referring to FIGS. 1 and 2, an exemplary method of bonding the first and second subassemblies 102, 104 according to the present disclosure will not be discussed. The first and second subassemblies 102, 104 are directly bonded by placing the first and second bonding layers 120, 140 in direct contact to form the assembled structure, and heat and pressure are applied to bond the first and second subassemblies 102, 104 together to form the bonded assembly 200. The first and second bonding surfaces 120a, 140a are placed in contact and diffuse together. In one embodiment, the first and second bonding surfaces 120a, 140a are polished prior to bringing these layers into contact. In one embodiment, the polishing may be performed by Chemical Mechanical Polishing (CMP), with bonding performed using conventional wafer bonding equipment.

Figure 3:
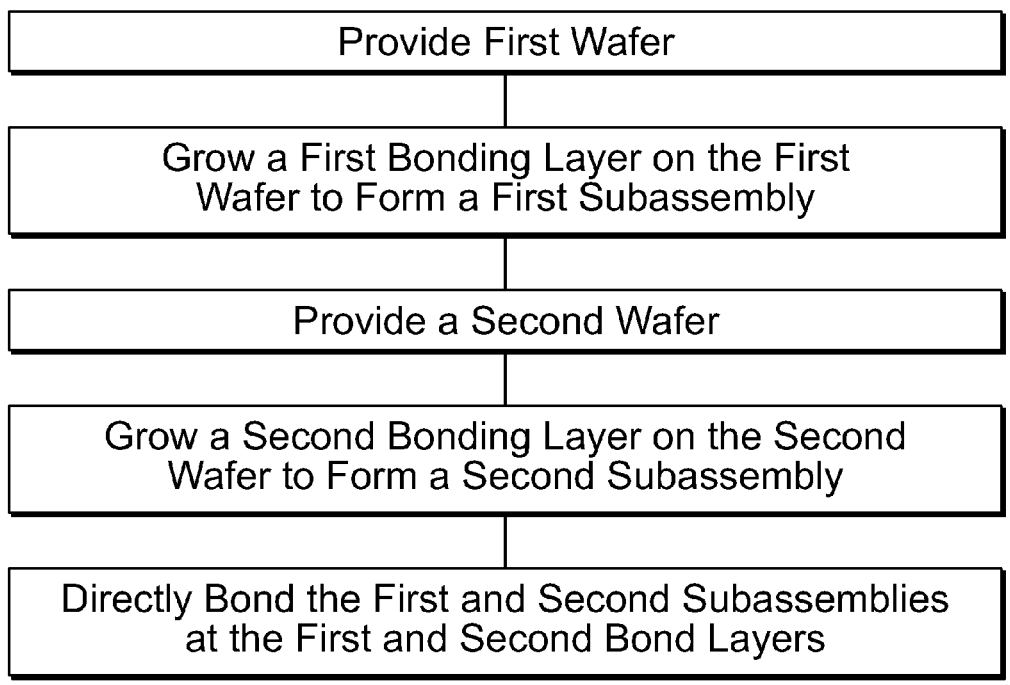
FIG. 3 is a flow chart of method steps for joining wafers according to the present disclosure.

The assembled structure is heated to bonding temperature of between about 300° C. to about 500° C. In one embodiment, the bonding temperature is between about 350° C. to about 450° C. In yet another embodiment, the bonding temperature is about 400° C. The assembled structure is heated at a pressure of between about 20 psi and about 50 psi. In one embodiment, the assembled structure is heated at a pressure of between about 30 psi and about 40 psi. In yet another embodiment, the assembled structure is heated at a pressure of about 35 psi. The assembled structure is heated under pressure for about 20 to 300 minutes. In an embodiment, the assembled structure is heated under pressure for about 60 to about 180 minutes. In yet another embodiment, the assembled structure is heated under pressure for about 120 minutes. Direct semiconductor bonding with the (Al)(Ga)InP (As)(Sb) bonding layer has achieved bond strength greater than 4.1 $J/m^2$, electrical resistance as low as 0.3 Ohm-$cm^2$ and optical transparency of greater than 97% across the bonded interface. The first and second bonding layers 120, 140 diffuse together to form a bonded layer. The first and second bonding surfaces 120a, 140a that are in contact diffuse together during the bonding process to provide a firm bond. A flow diagram of the general direct bonding method described above is shown in FIG. 3.

An embodiment of a method of bonding the first and second subassemblies 203, 206 of FIG. 1A to form the bonded assembly 200a of FIG. 2A will now be discussed. The first and second subassemblies 203, 206 are directly bonded by placing the first and second bonding layers 220, 240 in direct contact to form the assembled structure, and heat and pressure are applied to bond the first and second subassemblies 203, 206 together to form the bonded assembly 200A. The first and second bonding surfaces 220a, 240a are placed in contact and diffuse together. In one embodiment, the first and second bonding surfaces 220a, 240a are polished prior to bringing these layers into contact. In one embodiment, the polishing may be performed by Chemical Mechanical Polishing (CMP), with bonding performed using conventional wafer bonding equipment.

The assembled structure is heated to bonding temperature of between about 300° C. to about 500° C. In one embodiment, the bonding temperature is between about 350° C. to about 450° C. In yet another embodiment, the bonding temperature is about 400° C. The assembled structure is heated at a pressure of between about 20 psi and about 50 psi. In one embodiment, the assembled structure is heated at a pressure of between about 30 psi and about 40 psi. In yet another embodiment, the assembled structure is heated at a pressure of about 35 psi. The assembled structure is heated under pressure for about 20 to 300 minutes. In an embodiment, the assembled structure is heated under pressure for about 60 to about 180 minutes. In yet another embodiment, the assembled structure is heated under pressure for about 120 minutes. Direct semiconductor bonding with the (Al)(Ga)InP (As)(Sb) bonding layer has achieved bond strength greater than 4.1 $J/m^2$, electrical resistance as low as 0.3 Ohm-$cm^2$ and optical transparency of greater than 97% across the bonded interface. The first and second bonding layers 220, 240 diffuse together to form a bonded layer. The first and second bonding surfaces 220a, 240a that are in contact diffuse together during the bonding process to provide a firm bond. After direct bonding, one or both of the first and/or second base layers 212, 270 may be removed.

Figure 4A:
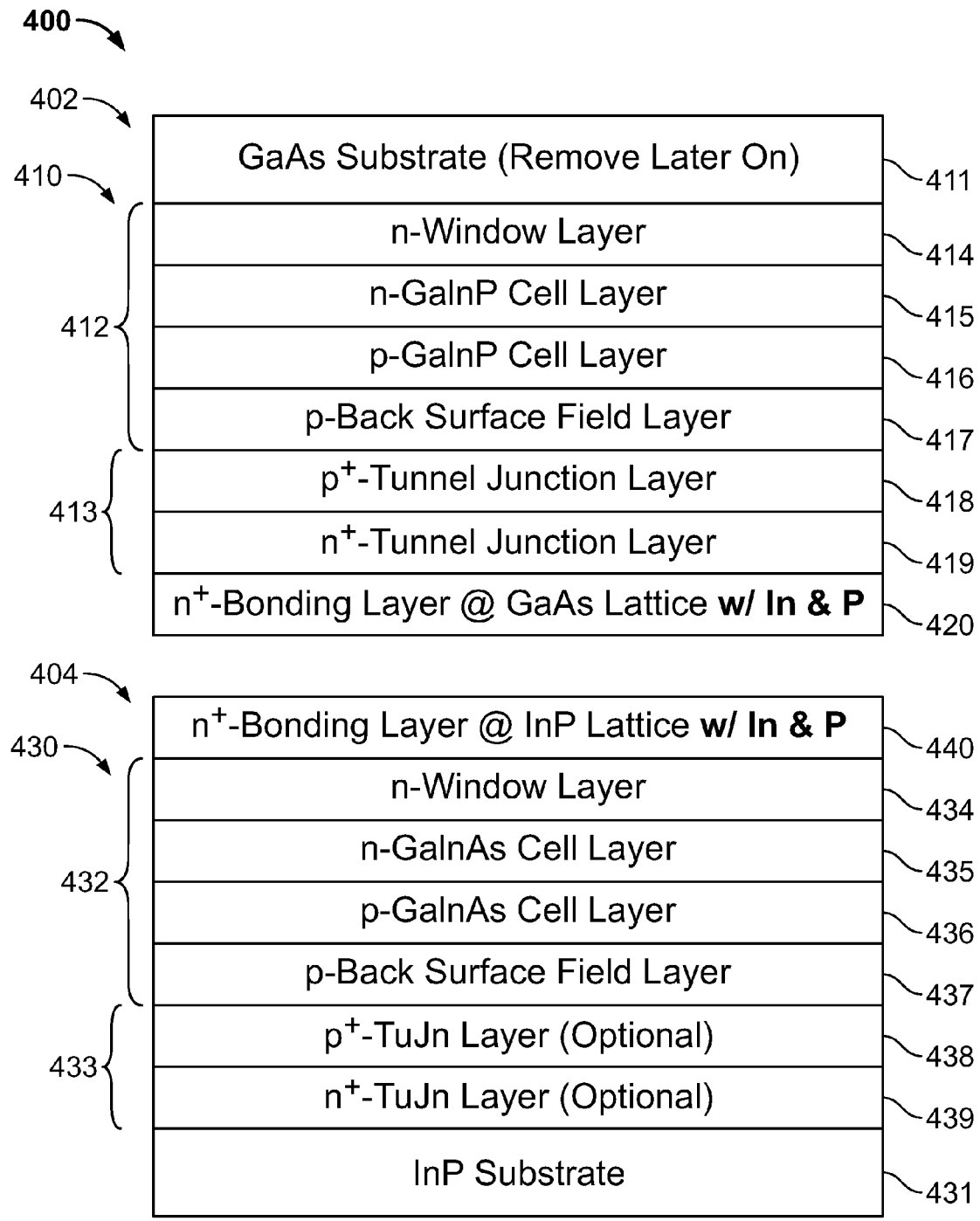
FIG. 4A illustrates another embodiment of preassembled structures according to the present disclosure.

FIG. 4A illustrates an embodiment of a preassembled structure 400 according to the present disclosure. The preassembled structure 400 includes a first subassembly 402 and a second subassembly 404. The first subassembly 402 includes a first PV structure 410 and a first bonding layer 420. The first PV structure 410 includes a GaAs substrate 411, a first solar cell 412, and a first tunnel junction 413. In another embodiment, the first PV structure 410 may include one or more solar cells, or in another word, subcells. In another embodiment, the first PV structure 410 may include one or more solar cells, or in another word, subcells, joined by one or more tunnel junctions. In another embodiment, the first solar cell 412 may be formed of a semiconductor material that is lattice matched to the GaAs substrate 411. The GaAs substrate 411 may be referred to as a growth substrate. In an embodiment, the semiconductor material may be a group III-V material. In another embodiment, the first PV structure 410 may be a GaAs-based, InP-based, GaP-based, GaSb-based, Ga(In)N- based material, e.g. AlGaAs, GaInP, GaInPAs, AlGaPAs, etc. lattice matched to the GaAs substrate 411.

The first solar cell 412 includes an n-doped window layer 414, an n-doped GaInP cell layer 415, a p-doped GaInP cell layer 416, and a p-doped back-surface field (BSF) layer 417. The first tunnel junction 413 includes a p-doped tunnel junction layer 418 and an n-doped tunnel junction layer 419.

The first bonding layer 420 is a highly n-doped (Al)(Ga)InP(As)(Sb) layer. As used herein, and as conventional in the art, the use of parentheses in the (Al)(Ga)InP(As)(Sb) material indicates that the incorporation of aluminum, gallium, arsenic and antimony is optional. The first bonding layer 420 is epitaxially grown on the first tunnel junction 413. The first bonding layer 420 has a thickness of between about 0.5 microns and about 2 microns. In another embodiment, the first bonding layer 420 has a thickness of between about 0.75 microns and about 1.5 microns. In yet another embodiment, the first bonding layer 420 has a thickness of about 1 micron.

The first bonding layer 420 is a highly doped bonding layer. As used herein, "highly doped" means having a dopant concentration of equal to or greater than about $5 \times 10^{18}/cm^3$. In an embodiment, the first bonding layer 420 has a dopant concentration of equal to or greater than about $1 \times 10^{19}/cm^3$. In this embodiment, the dopant is a n-type dopant. The dopant may be a n-type dopant may be silicon or tellurium. The first bonding layer 420 is lattice matched to the substrate 411. The first bonding layer 420 is transparent. As used herein, the term transparent means having a transmission of equal to or greater than 97% of light or electromagnetic radiation of a wavelength activating to a cell or subcell disposed underneath thereof. The first bonding layer 420 may be leveled and/or smoothed. In one embodiment, the first bonding layer 420 may be polished by Chemical Mechanical Polishing (CMP).

In another embodiment, another bonding layer (not shown) is epitaxially grown on another first PV device grown on the second side of the substrate 411. In an embodiment, the opposing bonding layer may be subsequently removed.

The second subassembly 404 includes a second PV structure 430 and a second bonding layer 440. The second PV structure 430 includes an InP substrate 431, a second solar cell 432, a second tunnel junction 433. The second solar cell 432 includes an n-doped window layer 434, an n-doped GaInAs cell layer 435, a p-doped GaInAs cell layer 436, and a p-doped back-surface field (BSF) layer 437. The second tunnel junction 433 includes a p-doped tunnel junction layer 438 and an n-doped tunnel junction layer 439. In another embodiment, the second PV structure 430 may be a PV device including one or more solar cells, or in another word, subcells. In another embodiment, the second PV structure 430 may be a GaAs-based, InP-based, InAs-based, AlAs-based GaSb-based, or Ga(In)N-based materials, e.g. GaInAs, AlInAs, GaAsSb, etc. having a lattice constant matching the growth substrate 431.

The second bonding layer 440 is a highly n-doped (Al)(Ga)InP(As)(Sb) layer. The second bonding layer 440 is epitaxially grown on the n-doped window layer 434. The second bonding layer 440 has a thickness of between about 0.5 microns and about 2 microns. In another embodiment, the second bonding layer 440 has a thickness of between about 0.75 microns and about 1.5 microns. In yet another embodiment, the second bonding layer 440 has a thickness of about 1 micron. In one embodiment, the second bonding layer 440 has the same thickness as the first bonding layer 420. In another embodiment, the second bonding layer 440 has a different thickness than the first bonding layer 420. According to the present disclosure, matching/differing thicknesses of the bonding layers 420 and 440 may have advantage if the transmission of light to the layers below the bonded interface is desired to be controlled by controlling optical absorption in the bonding layers. There may also be advantages for controlling the gradient of electric field across the bonded interface e.g. if a p-n junction is formed at the bonded interface. The second bonding layer 440 is lattice matched to the second subassembly 404. The second bonding layer 440 is transparent. The second bonding layer 440 may be leveled and/or smoothed. In one embodiment, the second bonding layer 440 may be polished by Chemical Mechanical Polishing (CMP).

In another embodiment, the tunnel junction 433 is omitted. Whether tunnel junction 433 is necessary depends on the polarity of the second substrate 431. The tunnel junction 433 will be necessary if n-type substrate 431 is used, whereas tunnel junction 433 will not be necessary if a p-type substrate 431 is used.

In another embodiment, an opposing second bonding layer (not shown) of the same composition is epitaxially grown on another second PV device grown on the second side of the substrate 431. In one embodiment, the opposing bonding layer may be subsequently removed.

In another embodiment, the first tunnel junction 413 is omitted, and the first bonding layer 420 is p-doped to form a tunnel junction when joined to the second subassembly 404. The p-type dopant may be carbon or zinc. In this exemplary embodiment, the first and second subassemblies 402, 404 may be joined to form a 2-junction solar cell. In another embodiment, the second tunnel layer 433 may be omitted, so that a two junction solar cell is formed when the first and second subassemblies 402, 404 are joined.

The bonded subassembly 400A may be further processed. In one embodiment, the GaAs first substrate 411 may be removed, and an antireflective (AR) coating may be deposited upon the first PV device n-doped window layer 414.

The first and second subassemblies 402, 404 are directly bonded by placing the first and second bonding layers 420, 440 in direct contact to form an assembled structure 400A, and then applying heat and pressure to bond the first and second subassemblies 402, 404 together. The surfaces in contact diffuse together but not the entire layers. In one embodiment, the first and second bonding layers 420, 440 are polished prior to bringing these layers into contact. In one embodiment, the polishing may be performed by Chemical Mechanical Polishing (CMP), with bonding performed using conventional wafer bonding equipment.

Figure 4B:
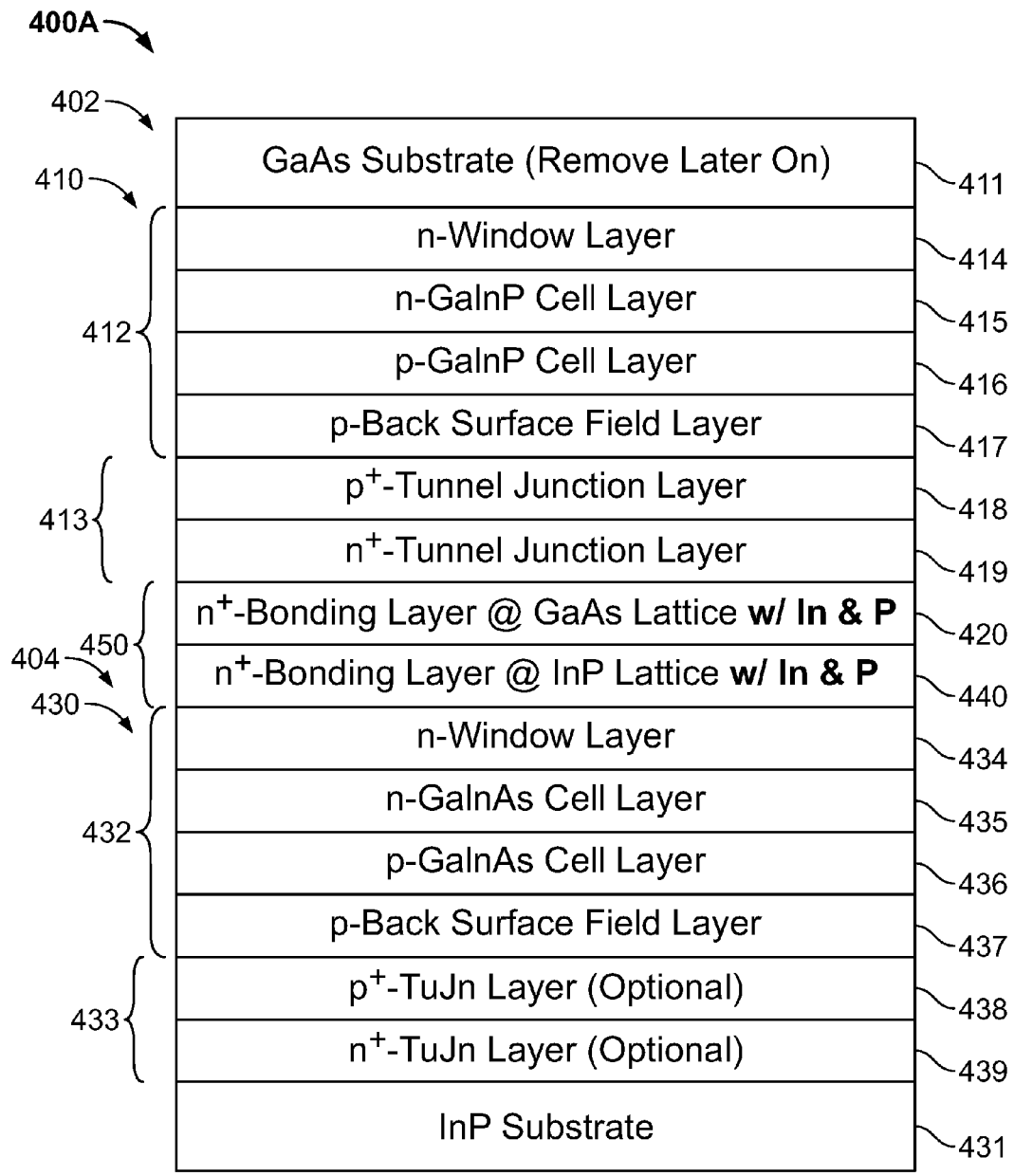
FIG. 4B illustrates the assembled structure of FIG. 4A according to the present disclosure.
Figure 6:
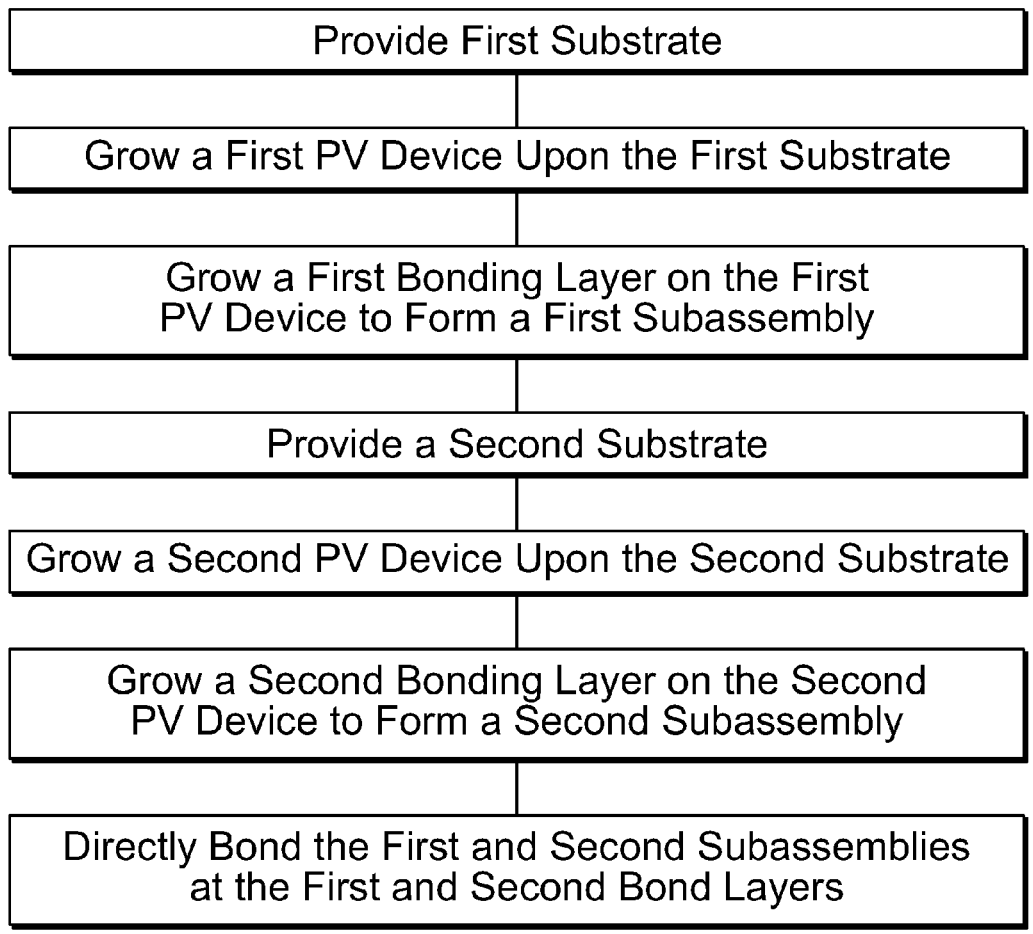
FIG. 6 is a flow chart of method steps for joining wafers according to the present disclosure.

The assembled structure is heated to bonding temperature of between about 300° C. to about 500° C. In one embodiment, the bonding temperature is between about 350° C. to about 450° C. In yet another embodiment, the bonding temperature is about 400° C. The assembled structure is heated at a pressure of between about 20 psi and about 50 psi. In one embodiment, the assembled structure is heated at a pressure of between about 30 psi and about 40 psi. In yet another embodiment, the assembled structure is heated at a pressure of about 35 psi. The assembled structure is heated under pressure for about 20 to 300 minutes. In an embodiment, the assembled structure is heated under pressure for about 60 to about 180 minutes. In yet another embodiment, the assembled structure is heated under pressure for about 120 minutes. Direct semiconductor bonding with the (Al)(Ga)InP(As)(Sb) bonding layer has achieved bond strength greater than 4.1 J/m$^2$, electrical resistance as low as 0.3 Ohm-cm$^2$ and optical transparency of greater than 97% across the bonded interface. After direct bonding, one or both of the substrates 411, 431 may be removed. The bonding layers 420, 440 diffuse together to form a fused, firm bonding layer 450 (FIG. 4B). A flow diagram of the general direct bonding method is shown in FIG. 6.

The disclosed method may be used to form PV devices having two or more cells. In one embodiment, the disclosed method may be used to form a PV device having an equal or different number of PV devices on opposing sides of the bonding layer. The disclosed method may also be used to make non-PV devices, such as LEDs, sensors or other devices.

FIG. 4B illustrates the assembled structure 400A formed from the preassembled structures 400 of FIG. 4A according to the present disclosure. The assembled structure 400A includes the first subassembly 402 and the second subassembly 404. The first and second subassemblies 402, 404 have been joined at the respective first and second bonding layers 420, 440. In this exemplary embodiment, the first and second bonding layers 420 are both n-doped, or in other words, similarly doped to form bonding layer 450.

Figure 5A:
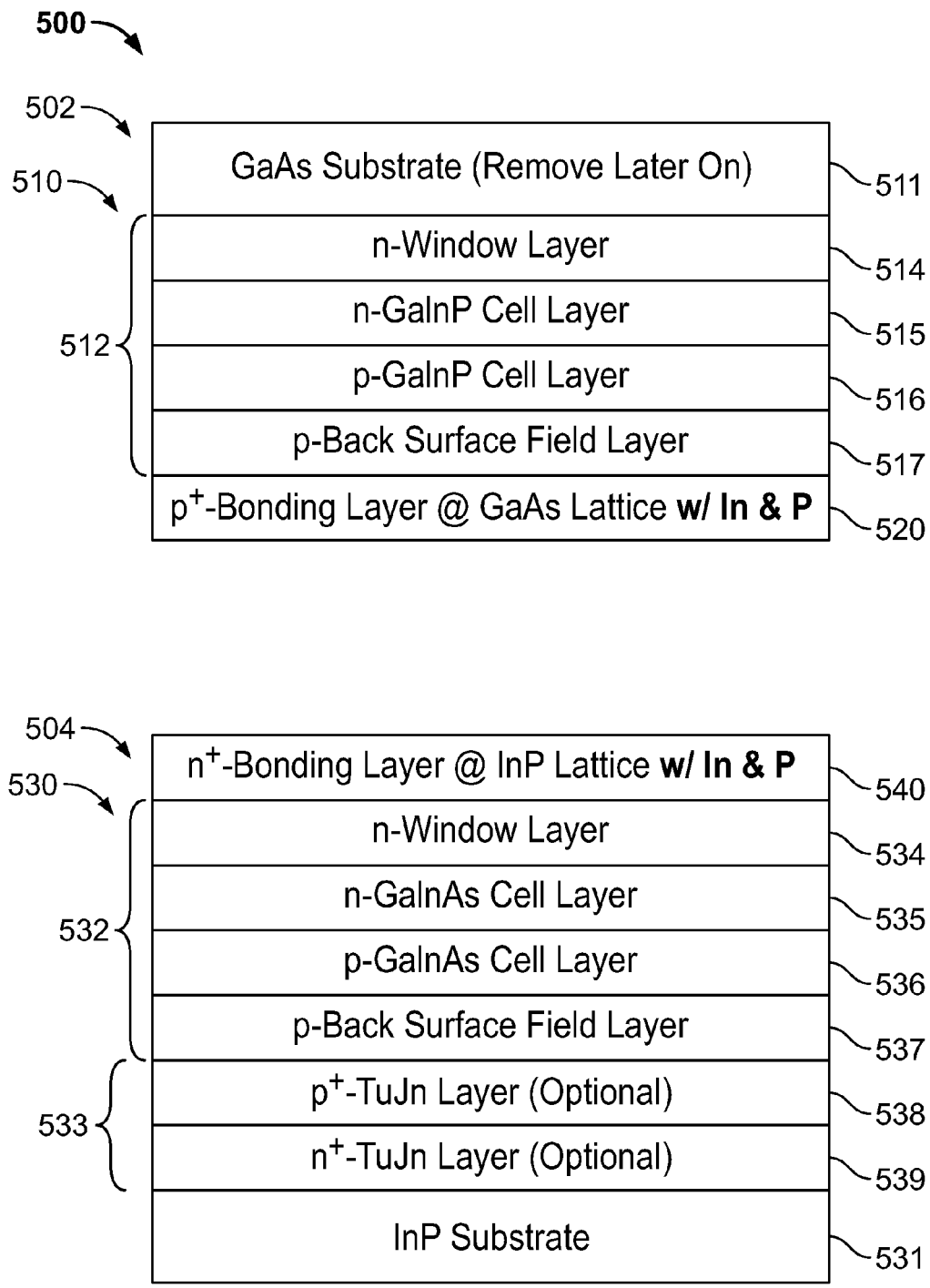
FIG. 5A illustrates another embodiment of preassembled structures according to the present disclosure.

FIG. 5A illustrates another embodiment of a preassembled structures 500 according to the present disclosure. The preassembled structure 500 includes a first subassembly 502 and a second subassembly 504. The first subassembly 502 includes a first PV structure 510 and a first bonding layer 520. The first PV structure 510 includes a GaAs substrate 511 and a first solar cell 512. In another embodiment, the first PV structure 510 may include one or more solar cells, or in another word, subcells. In another embodiment, the first PV structure 510 may include one or more solar cells, or in another word, subcells, joined by one or more tunnel junctions. In another embodiment, the first solar cell 512 may be formed of a semiconductor material that is lattice matched to the GaAs substrate 511. The GaAs substrate 511 may be referred to as a growth substrate. In an embodiment, the semiconductor material may be a group III-V material. In another embodiment, the first PV structure 510 may be a GaAs-based, InP-based, GaP-based, GaSb-based, Ga(In)N-based material lattice matched to the GaAs substrate 511.

The first solar cell 512 includes an n-doped window layer 514, an n-doped GaInP cell layer 515, a p-doped GaInP cell layer 516, and a p-doped back-surface field (BSF) layer 517.

The first bonding layer 520 is a highly p-doped (Al)(Ga)InP(As)(Sb) layer. As used herein, and as conventional in the art, the use of parentheses in the (Al)(Ga)InP(As)(Sb) material indicates that the incorporation of aluminum, gallium, arsenic and antimony is optional. The p-type dopant may be carbon or zinc. The first bonding layer 520 is epitaxially grown on BSF layer 517. The first bonding layer 520 has a thickness of between about 0.5 microns and about 2 microns. In another embodiment, the first bonding layer 520 has a thickness of between about 0.75 microns and about 1.5 microns. In yet another embodiment, the first bonding layer 520 has a thickness of about 1 micron. The first bonding layer 520 is lattice matched to the substrate 511. The first bonding layer 520 is transparent. The first bonding layer 520 may be leveled and/or smoothed. In one embodiment, the first bonding layer 520 may be polished by Chemical Mechanical Polishing (CMP).

In another embodiment, another bonding layer (not shown) is epitaxially grown on another first PV device grown on the second side of the substrate 511. In an embodiment, the opposing bonding layer may be subsequently removed.

The second subassembly 504 includes a second PV structure 530 and a second bonding layer 540. The second PV structure 530 includes an InP substrate 531, a second solar cell 532, a second tunnel junction 533. The second solar cell 532 includes an n-doped window layer 534, an n-doped GaInAs cell layer 535, a p-doped GaInAs cell layer 536, and a p-doped back-surface field (BSF) layer 537. The second tunnel junction 533 includes a p-doped tunnel junction layer 538 and an n-doped tunnel junction layer 539. In another embodiment, the second PV structure 530 may be a PV device including one or more solar cells, or in another word, subcells. In another embodiment, the second PV structure 530 may be a InP-based, InAs-based, AlAs-based, GaSb-based, or Ga(In)N-based structure, e.g. GaInAs, AlInAs, GaAsSb, etc. having a lattice constant matching the growth substrate 531.

The second bonding layer 540 is a highly n-doped (Al)(Ga)InP(As)(Sb) layer. The second bonding layer 540 is epitaxially grown on the n-doped window layer 534. The second bonding layer 540 has a thickness of between about 0.5 microns and about 2 microns. In another embodiment, the second bonding layer 540 has a thickness of between about 0.75 microns and about 1.5 microns. In yet another embodiment, the second bonding layer 540 has a thickness of about 1 micron. In one embodiment, the second bonding layer 540 has the same thickness as the first bonding layer 520. In another embodiment, the second bonding layer 540 has a different thickness than the first bonding layer 520. According to the present disclosure, matching/differing thicknesses may have advantage if the transmission of light to the layers below the bonded interface is desired to be controlled by controlling optical absorption in the bonding layers. There may also be advantages for controlling the gradient of electric field across the bonded interface in this embodiment, since a p-n junction is formed at the bonded interface. The second bonding layer 540 is lattice matched to the second subassembly 504. The second bonding layer 540 is transparent. The second bonding layer 540 may be leveled and/or smoothed. In one embodiment, the second bonding layer 540 may be polished by Chemical Mechanical Polishing (CMP).

In another embodiment, the tunnel junction 533 is omitted, so as to form a two-junction device when the first and second subassemblies 502, 504 are joined. Whether tunnel junction 533 is necessary depends on the polarity of the second substrate 531. The tunnel junction 533 will be necessary if n-type substrate 531 is used, whereas tunnel junction 533 will not be necessary if a p-type substrate 531 is used.

In another embodiment, an opposing second bonding layer (not shown) of the same composition is epitaxially grown on another second PV device grown on the second side of the substrate 531. In one embodiment, the opposing bonding layer may be subsequently removed.

Figure 5B:
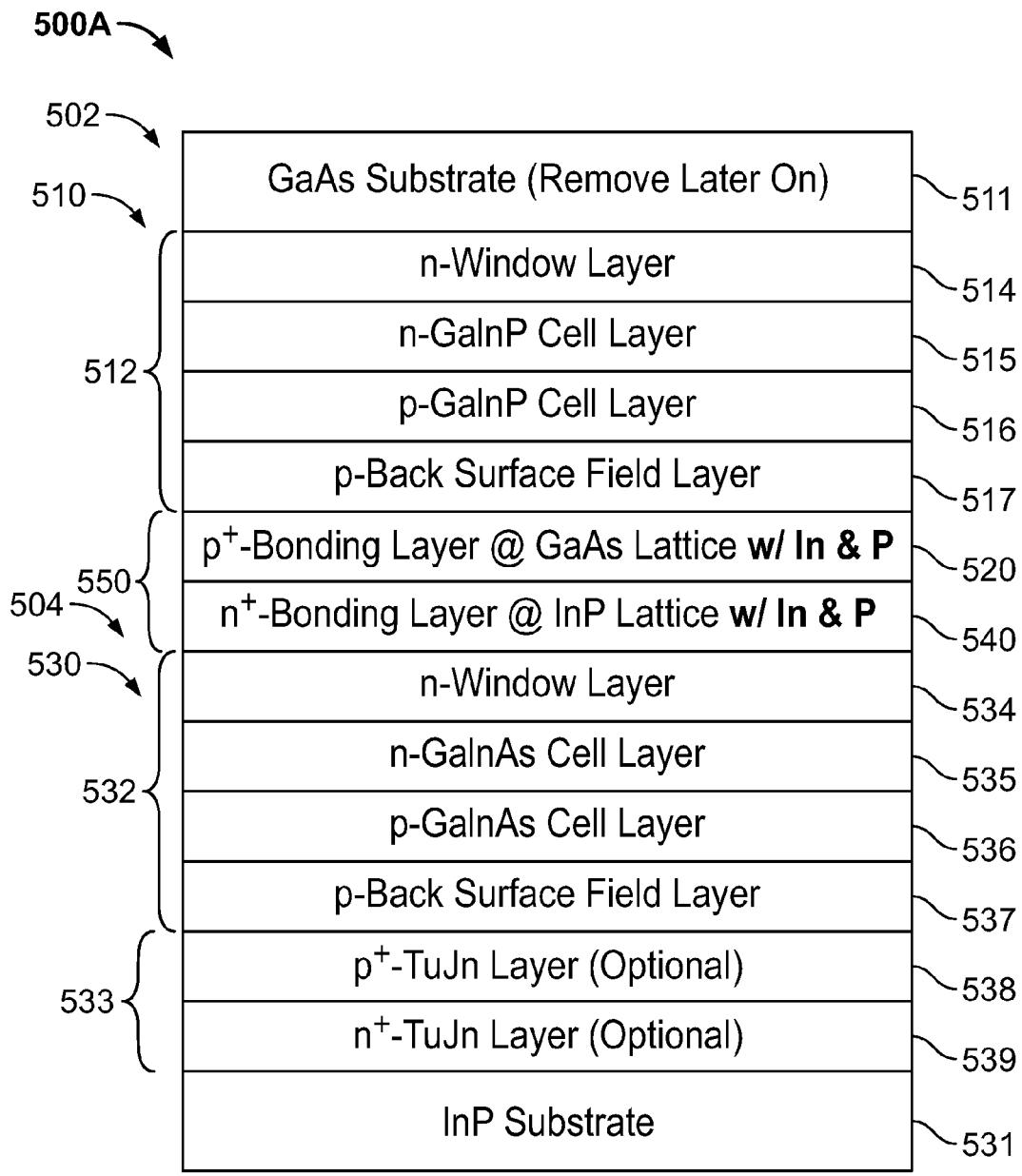
FIG. 5B illustrates the assembled structure of FIG. 5A according to the present disclosure.

The first and second subassemblies 502, 504 are directly bonded by the direct bonding method described above. The first and second subassemblies 502, 504 are directly bonded to from an assembled structure 500A shown in FIG. 5B. In this exemplary embodiment, the first and second bonding layers 520, 540 are dissimilarly doped, the first bonding layer 520 being p-doped and the second bonding layer being n-doped, and joined to form a p-n or tunnel junction 550.

The bonded subassembly 500A may be further processed. In one embodiment, the GaAs first substrate 511 may be removed, and an antireflective (AR) coating may be deposited upon the first PV device n-doped window layer 514.

Figure 7A:
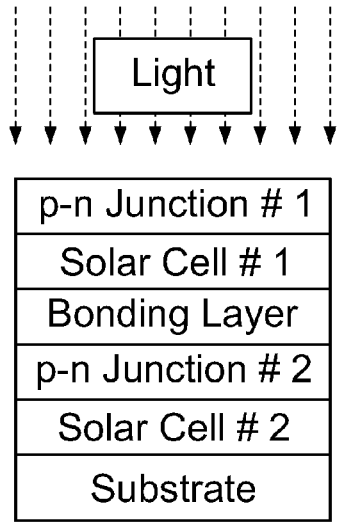
FIG. 7A illustrates another embodiment of assembled structures according to the present disclosure.
Figure 7B:
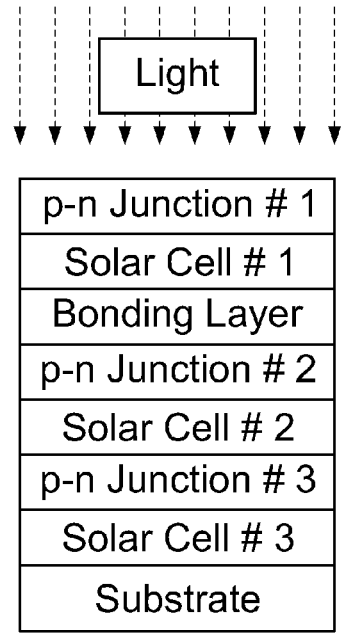
FIG. 7B illustrates another embodiment of assembled structures according to the present disclosure.
Figure 7C:
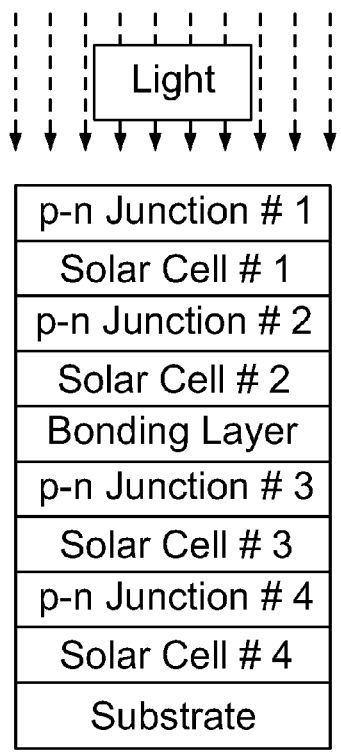
FIG. 7C illustrates another embodiment of assembled structures according to the present disclosure.
Figure 7D:
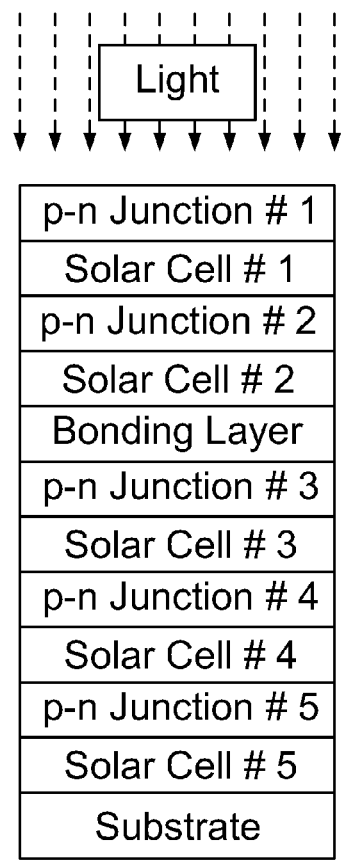
FIG. 7D illustrates another embodiment of assembled structures according to the present disclosure.

FIGS. 7A-D illustrate various embodiments of a multijunction solar cell in accordance with an embodiment of the disclosure. As can be seen in FIGS. 7A-D, the bonding layer may be used to form PV devices having an equal or different number of cells on opposite sides of the bonding layer. For example, the 2-junction solar cell shown in FIG. 7A has one solar cell on each side of the bonding layer. FIG. 7B illustrates a 3-junction PV device having a different number of cells on opposing sides of the bonding layer. FIG. 7C illustrates as 4-junction PV device having an equal number of cells on opposing sides of the bonding layer. FIG. 7D illustrates a 5-junction PV device having a different number of cells on opposing sides.

The disclosed direct bonding method may be used to form semiconductor bonded multijunction solar cell devices having two, three, four, five or more junctions. The bonded materials allowed the removal of the growth substrate and subsequent processing steps such as mesa etch isolation, anti-reflective coating, contact metal deposition, photolithographic patterning, soldering of interconnects and saw dicing—attesting to excellent mechanical robustness of the bonded interface. Solar cells formed by the disclosed direct bonding method exhibited fill factors exceeding 85% and external quantum efficiencies exceeding 90% in the bottom sub-cells, attesting to the low electrical resistance and high optical transmittance of the bonded interface.

According to the present disclosure, the inventors have unexpectedly discovered that bonding In and P containing bonding layers, such as, but not limited to GaInP to InP, results in a highly uniform wafer bonding with high mechanical strength (greater than 4 J/m$^2$), which can be achieved at relatively low bonding temperatures of 350° C. In addition, very low electrical resistance (on the order of 0.3 Ohm-cm$^2$) and high optical transmittance (greater than 97%) are achieved across the bonded interface.

Although a particular embodiment of the disclosure has been described in detail for purposes of illustration, various modifications and enhancements may be made without departing from the spirit and scope of the disclosure. Accordingly, the disclosure is not to be limited except as by the appended claims.

What is claimed is:

1. An assembly, comprising:
   a first subassembly further comprising,
      a first GaAs wafer substrate; and
      a first bonding layer upon the first wafer substrate, the first bonding layer lattice matched to the first wafer substrate;
   a second subassembly further comprising,
      a second InP wafer substrate; and
      a second bonding layer upon the second wafer substrate, the second bonding layer lattice matched to the second wafer substrate;
   wherein the first and second bonding layers are directly bonded to form an interface and to form the assembly;
   the assembly having a bond strength of greater than or equal to about 4 J/m$^2$ across the bond interface between the first and second bonding layers; and
   wherein the first bonding layer is an (Al)(Ga)InP(As)(Sb) layer; and
   the second bonding layer is an (Al)(Ga)InP(As)(Sb) layer.

2. The assembly of claim 1, wherein the first and second bonding layers have a dopant concentration equal to or greater than about 5×10$^{18}$/cm$^3$.

3. The assembly of claim 1, wherein the first and second bonding layers have a dopant concentration lower than about 5×10$^{18}$/cm$^3$.

4. The assembly of claim 1, wherein the first and second bonding layers are similarly doped.

5. The assembly of claim 1, wherein the first and second bonding layers are dissimilarly doped.

6. The assembly of claim 1, wherein the bonding layers form a tunnel junction.

7. The assembly of claim 1, wherein the first and second wafers further comprise one or more layers selected from the group consisting of Si, Ge, GaAs-based, InP-based, GaP-based, GaSb-based, and Ga(In)N-based materials.

8. The assembly of claim 1, wherein either or both the first and/or second wafers comprises one or more semiconductor layers.

9. The assembly of claim 1, wherein either or both the first and/or second wafers comprises one or more semiconductor devices.

10. The assembly of claim 9, wherein the one or more semiconductor devices is an InP-based device.

11. The assembly of claim 10, wherein the InP-based device is a solar cell.

12. A solar cell comprising the assembly of claim 1.

13. A method for making a bonded assembly, comprising:
   providing a first GaAs wafer;
   forming a first bonding layer upon the first wafer to form a first subassembly;
   providing a second InP wafer;
   forming a second bonding layer upon the second wafer to form a second subassembly; and
   directly bonding the first bonding layer to the second bonding layer to form an interface and to form the bonded assembly, the bonded assembly having a bond strength of greater than or equal to about 4 J/m$^2$ across the interface between the first and second bonding layers;
   wherein the first and second bonding layers are lattice matched to the first and second wafers, respectively;
   the first bonding layer is an (Al)(Ga)InP(As)(Sb) layer; and
   the second bonding layer is an (Al)(Ga)InP(As)(Sb) layer.

14. The method of claim 13, wherein the first and second bonding layers are bonded at a temperature between about 300° C. and about 500° C.

15. The method of claim 13, wherein the first and second bonding layers are bonded at a temperature of about 400° C.

16. The method of claim 13, wherein the first and second bonding layers are bonded at a pressure of between about 20 psi and about 50 psi.

17. The method of claim 13, wherein the first and second bonding layers have a dopant concentration equal to or greater than about 5×10$^{18}$/cm$^3$.

18. The method of claim 13, wherein the first and second bonding layers have a dopant concentration lower than about 5×10$^{18}$/cm$^3$.

19. The method of claim 13, wherein the first and second bonding layers are similarly doped.

20. The method of claim 13, wherein the first and second bonding layers are dissimilarly doped.

21. The method of claim 13, wherein the first and second wafers further comprise one or more layers selected from the group consisting of Si, Ge, GaAs-based, InP-based, GaP-based, GaSb-based, and Ga(In)N-based materials.

22. The method of claim 13, wherein either or both the first and/or second wafers comprises one or more semiconductor layers.

23. The method of claim 13, wherein either or both the first and/or second wafers comprises one or more semiconductor devices.

24. The method of claim 23, wherein the one or more semiconductor devices is an InP-based device.

25. The method of claim 13, wherein the bonded assembly is a solar cell.

26. The assembly of claim 1, wherein either or both the first and/or second wafers comprises one or more photovoltaic devices.

27. The assembly of claim 1, wherein the first bonding layer is lattice-matched to the GaAs wafer with In+P.

28. The assembly of claim 1, wherein the second bonding layer is lattice matched to the InP wafer with In+P.

29. The assembly of claim 1, wherein the first bonding layer is lattice matched to the GaAs wafer with In+P and the second bonding layer is lattice matched to the InP wafer with In+P.

30. An assembly, comprising:
- a first subassembly further comprising,
    - a first GaAs wafer substrate; and
    - a first bonding layer upon the first wafer substrate, the first bonding layer lattice matched to the first wafer substrate;
- a second subassembly further comprising,
    - a second InP wafer substrate; and
    - a second bonding layer upon the second wafer substrate, the second bonding layer lattice matched to the second wafer substrate;
- wherein the first and second bonding layers are directly bonded to form an interface and to form the assembly;
- the assembly having optical transmittance greater than or equal to about 97% across the bond interface between the first and second bonding layers; and
- wherein the first bonding layer is an (Al)(Ga)InP(As)(Sb) layer; and
- the second bonding layer is an (Al)(Ga)InP(As)(Sb) layer.

* * * * *